(12) United States Patent
Yu et al.

(10) Patent No.: US 10,734,349 B2
(45) Date of Patent: Aug. 4, 2020

(54) APPARATUS AND METHOD FOR PACKAGING COMPONENTS

(71) Applicant: CAPCON LIMITED, Hong Kong (CN)

(72) Inventors: Feng Yu, Singapore (SG); Hong Gang Wang, Singapore (SG); Yang Li, Singapore (SG); Yong Xin Wang, Singapore (SG)

(73) Assignee: CAPCON LIMITED, Hong Kong (CN)

( * ) Notice: Subject to any disclaimer, the term of this patent is extended or adjusted under 35 U.S.C. 154(b) by 0 days.

(21) Appl. No.: 16/071,504

(22) PCT Filed: Jan. 22, 2016

(86) PCT No.: PCT/CN2016/071706
§ 371 (c)(1),
(2) Date: Jul. 20, 2018

(87) PCT Pub. No.: WO2017/124424
PCT Pub. Date: Jul. 27, 2017

(65) Prior Publication Data
US 2019/0088615 A1    Mar. 21, 2019

(51) Int. Cl.
*H01L 23/00* (2006.01)
*H01L 21/67* (2006.01)
(Continued)

(52) U.S. Cl.
CPC ...... *H01L 24/742* (2013.01); *H01L 21/67144* (2013.01); *H01L 21/67766* (2013.01);
(Continued)

(58) Field of Classification Search
CPC . H01L 24/742; H01L 21/67144; H01L 24/11; H01L 21/67766; H01L 24/95; H01L 21/6838; H01L 2224/118; H01L 2224/951
See application file for complete search history.

(56) References Cited

U.S. PATENT DOCUMENTS

| 5,467,913 A | * | 11/1995 | Namekawa | .......... | B23K 3/0607 |
| | | | | | 221/211 |
| 6,013,899 A | * | 1/2000 | Eguchi | ................. | B23K 3/0623 |
| | | | | | 219/388 |
| 2018/0185967 A1 | * | 7/2018 | Muraoka | ................ | B23K 35/40 |

FOREIGN PATENT DOCUMENTS

| CN | 1179696 A | 4/1998 |
| CN | 1639841 A | 7/2005 |

(Continued)

OTHER PUBLICATIONS

International Search Report and Written Opinion for corresponding International Application No. PCT/CN2016/071706 dated Oct. 12, 2016 with English translation of International Search Report.
(Continued)

*Primary Examiner* — Zandra V Smith
*Assistant Examiner* — Andre C Stevenson
(74) *Attorney, Agent, or Firm* — Renner, Otto, Boisselle & Sklar, LLP

(57) ABSTRACT

A component packaging apparatus includes: at least one component supply device; at least one component processing device, which is configured to process components provided by the component supply device; at least one component transfer device, each component transfer device respectively having multiple bond heads, each bond head transferring one of the said components which are processed by the component processing device; wherein the component processing device comprises a pick-up platform, which is configured to simultaneously arrange the multiple com-
(Continued)

ponents, and the multiple bond heads are configured to pick up the multiple components simultaneously from the pickup platform at one time. A method for packaging components is also provided.

31 Claims, 13 Drawing Sheets

(51) Int. Cl.
*H01L 21/677* (2006.01)
*H01L 21/683* (2006.01)

(52) U.S. Cl.
CPC .............. *H01L 24/11* (2013.01); *H01L 24/95* (2013.01); *H01L 21/6838* (2013.01); *H01L 24/75* (2013.01); *H01L 2224/118* (2013.01); *H01L 2224/7501* (2013.01); *H01L 2224/7598* (2013.01); *H01L 2224/75744* (2013.01); *H01L 2224/951* (2013.01)

(56) References Cited

FOREIGN PATENT DOCUMENTS

| | | | |
|---|---|---|---|
| CN | 203387842 U | | 1/2014 |
| CN | 20132400606 | * | 1/2014 |
| CN | 103560093 A | | 2/2014 |
| CN | 104701199 A | | 6/2015 |
| KR | 100995845 B1 | | 11/2010 |

OTHER PUBLICATIONS

International Preliminary Report on Patentability for corresponding International Application No. PCT/CN2016/071706 dated Apr. 16, 2018.

* cited by examiner

APPARATUS AND METHOD FOR PACKAGING COMPONENTS

FIELD OF THE INVENTION

The invention relates to advanced packaging technology in semiconductor industry, more particularly to an apparatus and a method for producing flip chip.

BACKGROUND OF THE INVENTION

At present, the consumer demand for electronic products which implement microelectronic chips therein is constantly increasing, and the competition between products is becoming increasingly fierce. In order for microelectronics to win in this competition, time-to-market of product is very critical. In other words, the process from design to launch of product must be as short as possible in order to introduce the most innovative and technologically advanced products. In addition, the price of the product is also an important competitive factor. To this end, manufacturers of microelectronic products have been eager to own more innovative technologies to improve productivity, reduce unit costs, improve competitive advantages and meet huge consumer demand.

For example, in the production of flip-chips, the basic processes of a flip chip assembly apparatus comprise picking up die from wafer, flipping the die to invert upside down, applying flux to the die, aligning position at inspection camera and bonding the die on the substrate. A conventional flip chip assembly apparatus is provided with a single bond head, wherein the duty cycle of the apparatus comprises: the single bond head picking up a single die and dipping into flux and then bonding to the substrate. Another conventional flip chip assembly apparatus is provided with multiple bond heads, each bond head picking up one die, wherein the working cycle of the apparatus comprises: each bond head picks up one die one by one and dipping the die into flux one by one, and then bonding each die on the substrate one by one. With said such conventional flip chip assembly apparatus, it has been found that the effect of attempting to achieve higher productivity by speeding up the operation of the device is very limited, because the dies are picked up and dipped one by one, and the work cycle related to a die can begin only after the work cycle related to the previous die is completed.

In addition, conventional chip assembly apparatus can only handle one type of wafer in a single workflow, so that only one type of die can be bonded to one substrate. If multiple type of dies are desired to be bonded on the same substrate at the same time, two devices should be combined together. This way of combination of multiple devices makes the production line very large and complex, and the reliability cannot be assured.

For this reason, there is still a technical need in the prior art to further improve the productivity of component packaging, and it is also desirable to handle more complicated packaging in a single device.

SUMMARY OF THE INVENTION

In one aspect, the invention provides an component packaging apparatus comprising at least one component supply device, at least one component processing device configured to process the component provided by the component supply device, and at least one component transfer device. Each component transfer device has multiple bond heads. Each bond head for transferring one of the components processed by the component processing device. The component processing device comprises a pick-up platform which is constructed to arrange multiple components. The multiple bond heads are configured to pick up multiple above mentioned components simultaneously from the pick-up platform at one time.

A pick-up platform is provided in the component processing device of the component packaging apparatus for simultaneously arranging multiple components that are detected as qualified. Thus, multiple bond heads of a component transfer device in the apparatus may be correspondingly disposed to the multiple components on the pick-up platform, such that the multiple bond heads can simultaneously pick up the multiple components from the pick-up platform at one time. Such a configuration can greatly improve the productivity of the apparatus compared to the prior art in which the bond head directly detects, selects, aligns, and picks up the die from, for example, wafers.

Further, the component packaging apparatus further comprises at least one dipping station, the dipping station having a receptacle containing flux, and the receptacle being configured to allow the multiple components on the bond heads of the component transfer device simultaneously to be dipped into flux in the receptacle at one time. Such a configuration further improves the productivity of the apparatus as compared with the prior art in which the components to be processed are dipped one-by-one, since it is possible to simultaneously dip multiple components.

Preferably, the dipping station further comprises a dispenser configured to fill the receptacle with flux.

Preferably, the component packaging apparatus has two independently operated component transfer devices. Having two independently operated component transfer devices enables apparatus to process packaging two components simultaneously, which may contribute to productivity. More importantly, two independently operated component transfer devices enable the apparatus to process different component simultaneously, bonding different components on the same substrate simultaneously, and thereby completing complex packaging processes by a single apparatus. More preferably, the component transfer device comprises a beam, the multiple bond heads are mounted on the beam and can move along the beam in the direction of length of the beam, and/or, the multiple bond heads are configured to be movable independently in the vertical direction relative to the beam, and/or, the multiple bond heads are configured to be movable together in a horizontal direction perpendicular to the beam, and/or, the multiple bond heads are configured to be independently rotatable around respective axis.

Preferably, the multiple bond heads are configured such that the horizontal distance between each bond head can be adjusted. The purpose is to suitable for different applications, such as different distance between die placement station on the pick-up platform, or specific gripping positions of different dies.

Preferably, the component packaging apparatus has two independently operated component supply devices. Further, the two component supply devices respectively provide different components.

Preferably, the component packaging apparatus has two independently operated component processing devices, each component processing device being configured to process the components provided by the corresponding component supply device.

Preferably, the component processing device comprises a flipper for reversing the direction of the charging surface of the component upside down. The flipper is configured to be suitable for packaging flip chips.

Preferably, the pick-up platform is provided with a first vacuum device for fixing the components.

Preferably, the pick-up platform are configured to be adjusted to arrange a different number of components.

Preferably, the pick-up platform can be adjusted such that each component arranged is aligned with a corresponding bond head.

Preferably, the component packaging apparatus further comprises a substrate supply device configured to provide at least one substrate. The components are bonded to corresponding substrate(s) by bond heads after being dipped into flux. Further, the substrate supply device comprises at least two channels, and each channel is configured to support one of the substrates. Further, the at least two channels can be recombined into one channel to accommodate substrates having different sizes. Further, the substrate supply device has a second vacuum device to fix the substrates.

In another aspect, the invention provides a component packaging apparatus, comprising: at least one component supply device; at least one component processing device, which is configured to process components provided by the component supply device; at least one component transfer device, each component transfer device respectively having multiple bond heads, each bond head transferring one of the said components which are processed by the corresponding component processing device; at least one dipping station, the dipping station having a receptacle containing flux; wherein the receptacle being configured to allow the multiple components on the bond heads of the corresponding component transfer device to be simultaneously dipped into flux in the receptacle at one time.

Preferably, the component processing device comprises a pick-up platform, which is configured to simultaneously arrange the multiple components, and the multiple bond heads are configured to pick up the multiple components simultaneously from the pick-up platform at one time.

In still another aspect, the invention provides a component packaging apparatus, comprising: at least one component supply device; at least one component processing device, which is configured to process the components provided by the corresponding component supply device; at least one component transfer device, each component transfer device respectively having multiple bond heads, each bond head transferring one of the said components which are processed by the corresponding component processing device; at least one dipping station, the dipping station having a receptacle containing flux; wherein the component processing device comprises a pick-up platform, which is configured to simultaneously arrange the multiple components, and the multiple bond heads are configured to pick up the multiple components simultaneously from the pick-up platform at one time; and wherein the receptacle being configured to allow the multiple components on the bond heads of the corresponding component transfer device to be simultaneously dipped into flux in the receptacle at one time.

In still another aspect, the invention provides a method for packaging components, comprising: providing first components by a first component supply device; processing the first components by a first component processing device, and arranging the multiple first components on a first pick-up platform; picking up the multiple first components from the first pick-up platform by a first component transfer device using multiple first bond heads mounted on the beam, each first bond head transferring one of the first components; dipping the multiple components on the first bond heads into flux in the flux receptacle at the first dipping station; providing substrates by a substrate supply device, and bonding the first components, which have been dipped into flux, to the substrate(s) by the first bond heads; wherein the multiple first bond heads pick the multiple components simultaneously from the first pick-up platform at one time.

Preferably, the multiple components on the first bond heads are simultaneously dipped into flux at one time.

Preferably, the method further comprises adding flux to the receptacle by a flux dispenser.

Preferably, the method further comprises moving the first bond head along a beam in the direction of length of the beam, such that each first bond head is aligned with the corresponding first component on the first pick-up platform.

Preferably, the method further comprises moving the first bond head in the vertical direction relative to a beam, such that each first bond head is aligned with the corresponding first component on the first pick-up platform.

Preferably, the method further comprises moving the first bond head relative to a beam in a horizontal direction perpendicular to the beam, such that each first bond head is aligned with the corresponding first component on the first pick-up platform.

Preferably, the method further comprises: providing second components by a second component supply device; processing the second components by a second component processing device, and arranging the multiple second components on a second pick-up platform; picking up the multiple second components from the second pick-up platform by a second component transfer device using multiple second bond heads mounted on the beam, each second bond head transferring one of the second components; dipping the multiple components on the second bond head into flux in the flux receptacle at the second dipping station; bonding the second components, which have been dipped into flux, to the substrate(s) by the second bond heads.

Preferably, the multiple second bond heads pick the multiple second components simultaneously from the second pick-up platform at one time.

Preferably, the multiple second components are simultaneously dipped into flux at the second dipping station at one time.

Preferably, the first component supply device and the second component supply device operate independently.

Preferably, the first component and the second component are different components.

Preferably, further comprises reversing the components upside down by the flipper.

Preferably, the substrate supply device comprises at least two channels, and each channel is configured to support one of the substrates.

Preferably, the at least two channels can be recombined into new channel to accommodate substrates having different sizes.

In still another aspect, the invention provides a method for packaging components, comprising: providing components by a component supply device; processing the components by a component processing device, and arranging the multiple components on a pick-up platform; picking up the multiple components from the pick-up platform by a component transfer device using multiple bond heads mounted on the beam, each bond head transferring one of the components; dipping the multiple components on the bond head into flux in the flux receptacle at the dipping station; providing (a) substrate(s) by a substrate supply device, and bonding the components, which have been dipped into flux, to the substrate(s) by the bond heads; wherein the multiple components on the bond heads are simultaneously dipped into flux at one time.

In still another aspect, the invention provides a method for packaging components, comprising: providing components by a component supply device; processing the components by a component processing device, and arranging the multiple components on a pick-up platform; picking up the multiple components from the pick-up platform by a component transfer device using multiple bond heads mounted on the beam, each bond head transferring one of the components; dipping the multiple components on the bond head into flux in the flux receptacle at the dipping station; providing (a) substrate(s) by a substrate supply device, and bonding the components, which have been dipped into flux, to the substrate(s) by the bond heads; wherein the multiple bond heads pick up simultaneously the multiple components from the pick-up platform at one time; and the multiple components on the bond heads are simultaneously dipped into flux at one time.

Other aspects and further advantages of the present invention will be described hereinafter with reference to the specific examples and the figures.

BRIEF DESCRIPTION OF DRAWINGS

FIGS. 11a-11b are schematic views of the dipping step of the method in FIG. 9, wherein FIG. 11b is an enlarged view of the circled portion shown in FIG. 11a.

FIGS. 12a-12b are schematic views of the bonding step of the method in FIG. 9, wherein FIG. 12a shows a top view of a substrate bonded with two types of components, and FIG. 12b is a front view of the same.

FIGS. 14a-14c illustrate a prior method for component packaging by using multiple bond heads, wherein FIG. 14a is a flowchart of the prior method, FIG. 14b is a schematic view of the picking step of the prior method, and FIG. 14c is a schematic view of the dipping step of the prior method.

DETAILED DESCRIPTION OF THE EMBODIMENTS

Before illustrating any embodiment of the invention in detail, it is to be understood that the application of the invention is not limited to the details of the construction of the invention and the process of the method as illustrated in the following description. The invention could comprise other embodiments and can be practiced or implemented in a variety of different ways.

As used herein, the term "component" comprises any product suitable for the device and method of the present invention, such as but not limited to, a die, an integrated circuit (IC), a discrete device, modules, a module.

Herein, the terms "upward", "downward", "left", "right", "front", "back", "inside", "outside", "horizontal", "longitudinal", "intermediate", "lateral", etc., unless otherwise specified, describes the orientations shown on the figures.

Herein, the terms "first", "second", etc. are used merely to distinguish different device or step to indicate that the device or step is independent with each other, but are not used to define the limitation in aspects, such as importance, order and location, of the device or step.

The component packaging apparatus and method according to the present invention can be used to process a variety of suitable components. However, as an example, specific embodiments thereof are specifically described below only with the processing of integrated chips. Those skilled in the art will understand that the integrated chips in these embodiments can also be replaced with other suitable components in accordance with the spirit and principles of the present invention, and such embodiments also fall within the scope of the present invention.

Figure 1:
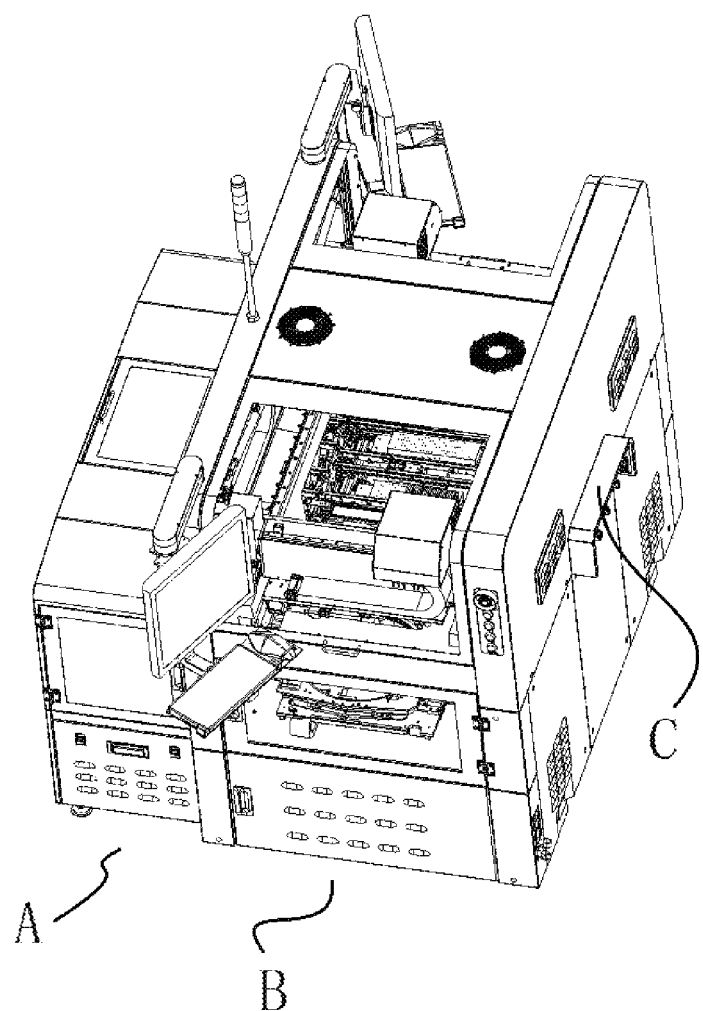
FIG. 1 shows a perspective view of a component packaging apparatus in one example of the invention.

FIG. 1 shows a specific component packaging apparatus according to the present invention. In the lateral direction, the component packaging apparatus is mainly composed of an inlet A, a processor part B, and an outlet C. During the processing, wafers and the substrates are loaded from the inlet A, and then transferred to the processor part B for packaging, and finally the packaged integrated chips are sent out from the outlet C.

Figure 2:
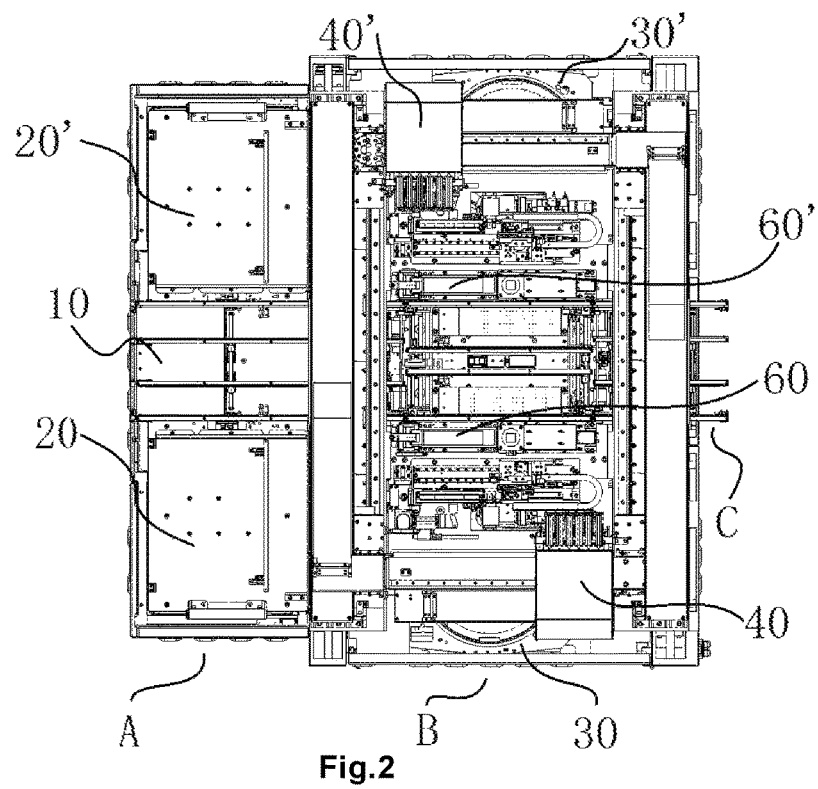
FIG. 2 shows the top view of the component packaging apparatus shown in FIG. 1, where part of housing is removed to better illustrate internal construction of the apparatus.

Referring to FIG. 2, which is a top view of the component packaging apparatus shown in FIG. 1, and part of its housing has been removed to better illustrate its internal configuration. As can be seen from FIG. 2, in the longitudinal direction, the inlet A comprises a substrate supply device 10 mounted in the center, and a first component supply device 20 and a second component supply device 20' symmetrically disposed on both sides and independently operated. The processor part B comprises a first component processing device 30 and a second component processing device 30', a first component transfer supply device 40 and a second component transfer supply device 40', a first dipping station 60 and a second dipping station 60', and each said pair are symmetrically arranged and independently operated. Those skilled in the art will understand from the spirit and principles of the present invention that the component packaging apparatus according to the present invention may also have only one or more than two component supply devices (s), component processing device (s), component transfer device (s), and dipping station (s), and such embodiments also fall within the scope of the invention. The first component supply device 20 and second component supply device 20', the first component processing device 30 and the second component processing device 30', the first component transfer supply device 40 and the second component transfer supply device 40', and the first dipping station 60 and the second dipping station 60' of the component packaging apparatus according to the present invention, may be substantially same or different, respectively. In the present embodiment, the devices are the same, so the following description only introduce the first component supply device 20, the first component processing device 30, the first component transfer supply device 40, and the first dipping station 60.

Figure 3:
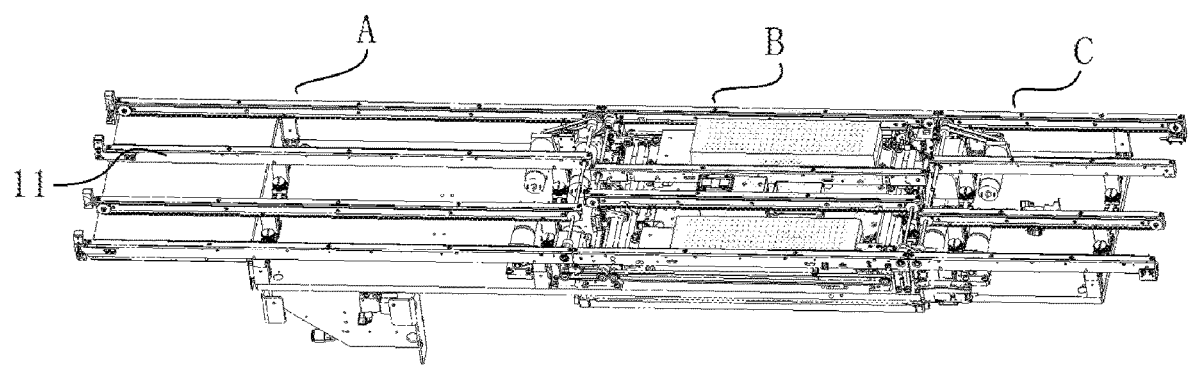
FIG. 3 is a perspective view of the substrate transport device of the component packaging apparatus shown in FIG. 1.

The component packaging apparatus further comprises a substrate transport device. As shown in FIGS. 2 and 3, the substrate transport device comprises four slide rails 11 of the substrate supply device 10 in the inlet A, four slide rails in the processor part B, and four slide rails in the outlet C, which are sequentially connected. Thus, two continuous channels are formed through the component packaging apparatus in the transverse direction, each channel supporting one substrate. In operation, a substrate is placed into a channel from the inlet A and transported along the channel to the corresponding position of the processor part B by a drive mechanism (not shown) to bond the die. After bonding the dies on the substrate, the substrate continues to be ejected from the outlet C along the channel by the drive mechanism. The substrate transport device composed of slide rails and a drive mechanism belongs to the prior art and should be known to those skilled in the art, and therefore will not be described herein.

Those skilled in the art will understand, in light of the spirit and principles of the present invention, that the component packaging apparatus according to the present invention may also have only one component or have more than two channels for supporting and transporting the substrate, and the channels may be configured such that the width is adjustable to accommodate substrates with different size. For example, the two channels in this embodiment can be combined into one channel so that a substrate having a larger size can be accommodated therein. Further, the substrate supply device may be provided with a vacuum device to fix the substrate.

It will be understood that the component packaging apparatus illustrated in the figures can achieve more complex processing through a unified control system. For example, different dies can be loaded on the first component supply device and the second component supply device, respectively, so that different dies can be bonded simultaneously on the same substrate. As another example, different substrates can be separately loaded on the two channels of the substrate supply device, thereby enabling simultaneous processing of two different substrates.

Figure 4:
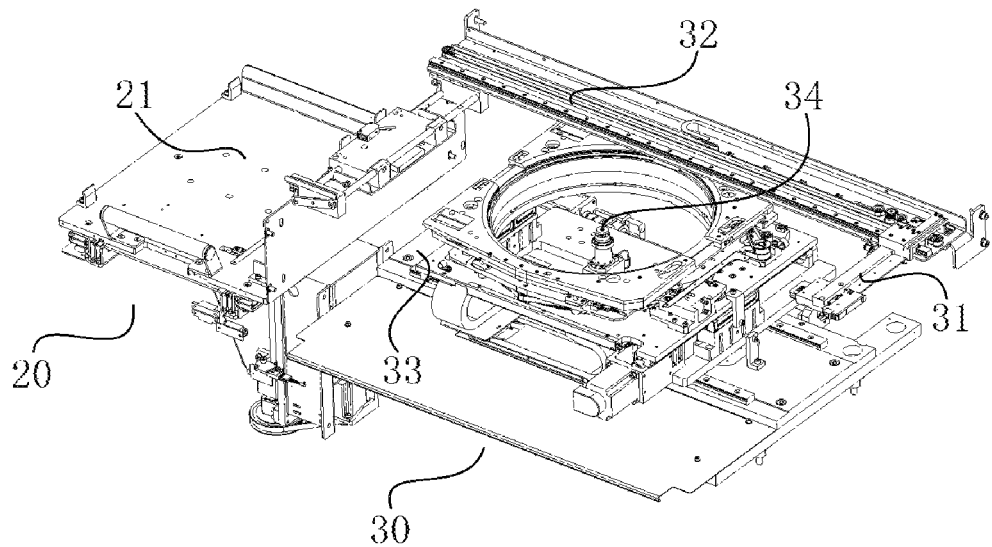
FIG. 4 is a partial perspective view of the component supply device and the component processing device of the component packaging apparatus shown in FIG. 1.

Referring to FIG. 4, FIG. 4 is a perspective view of component supply device 20 and component processing device 30 of the component packaging apparatus shown in FIG. 1. As shown, the pick station 21 in the component supply device 20 is used to load the wafer cassette, and the pick station 21 can be moved vertically to adjust to a suitable height. Component processing device 30 comprises a gripper 31 that grabs a wafer from a wafer cassette. As shown in FIG. 4, the gripper 31 is supported on a slide rail 32 and can be movable along the slide rail 32. When the wafer is needed to be grasped, the gripper 31 moves along the slide rail 32 toward the wafer cassette, after grabbing a wafer from the wafer cassette, moving toward the wafer table and placing the wafer on the wafer table 33, and then continuing moving away from wafer table 33 till to a safe location. The wafer table 33 can be moved vertically and rotated to align the wafer. The camera on the wafer table 33 will then inspect the wafer for a good die. Once the good die is found, the ejector 34 on the wafer table 33 separates the die from the wafer.

Figure 5:
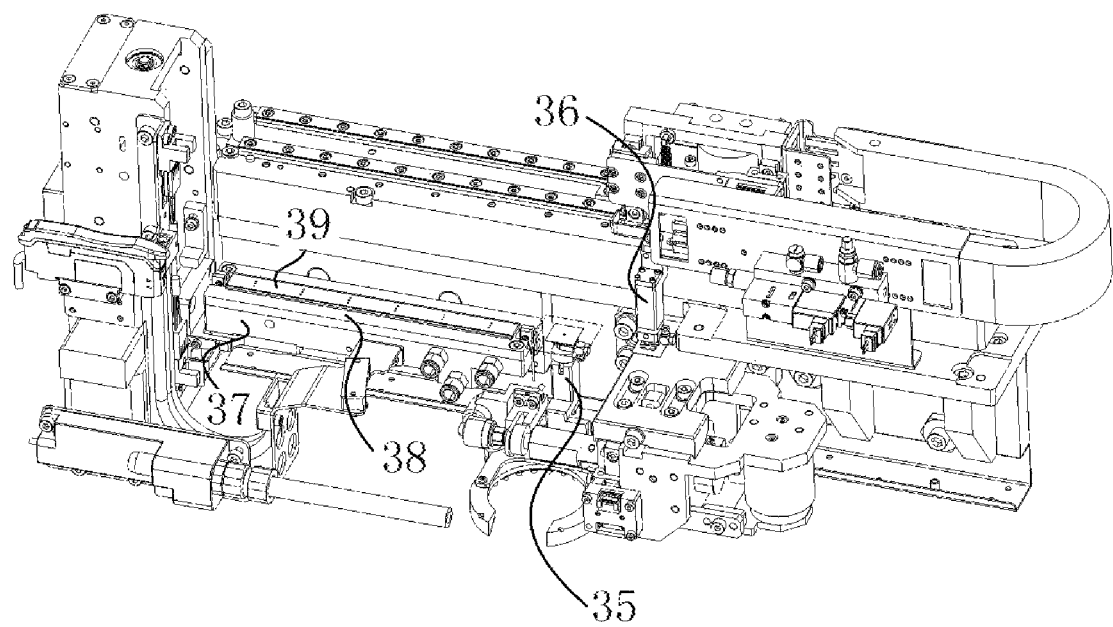
FIG. 5 is a partial perspective view of the component processing device of the component packaging apparatus shown in FIG. 1.

Referring to FIG. 5, FIG. 5 is a partial perspective view of the component processing device 30 of the component packaging apparatus shown in FIG. 1. In FIG. 5, for the sake of brevity, the gripper and the wafer table, etc. of the component processing device shown in FIG. 4 are omitted. As shown in FIG. 5, the component processing device 30 further comprises a flipper 35, a gripper 36, and a pick-up platform 37. The flipper 35 is used to grasp the dies that have been separated on the wafer table 33 and reverses the direction of die upside down. More specifically, in general, the charging surface of the die of the wafer on the wafer table 33 is substantially horizontally upward, and the flipper 35 grabs the die and flip the die to 180°, thereby enabling the charging surface of the die is facing downward. Thereafter, the gripper 36 grabs the die that has been reversed by the flipper 35, moves to the pick-up platform 37, and places the die at designated location of the pick-up platform 37. The flipper 35 and the gripper 36 are all known to those skilled in the art. The pick-up platform 37 is for continuously arranging multiple dies at specific intervals. As shown, the pick-up platform 37 comprises a plate 38 on which multiple placement stations 39 are disposed, each placement station 39 placing a die. The number of placement stations 39 on each plate 38 is fixed. To this end, a variety of plates can be provided, each with a different number of stations, so that the plate with the corresponding number of placement stations can be selected as needed before operation. Additionally, a first vacuum device can be disposed on the pick-up platform 37 for securing the die that is placed on the plate. It must also be pointed out that the pick-up platform shown in figures can be adjusted in vertical direction so that the pick-up platform can be lowered downwards to a level substantially flush with the gripper in order to load the die, and can rise to a predetermined height in order to be obtained by the component transfer device after the die is loaded.

Figure 6:
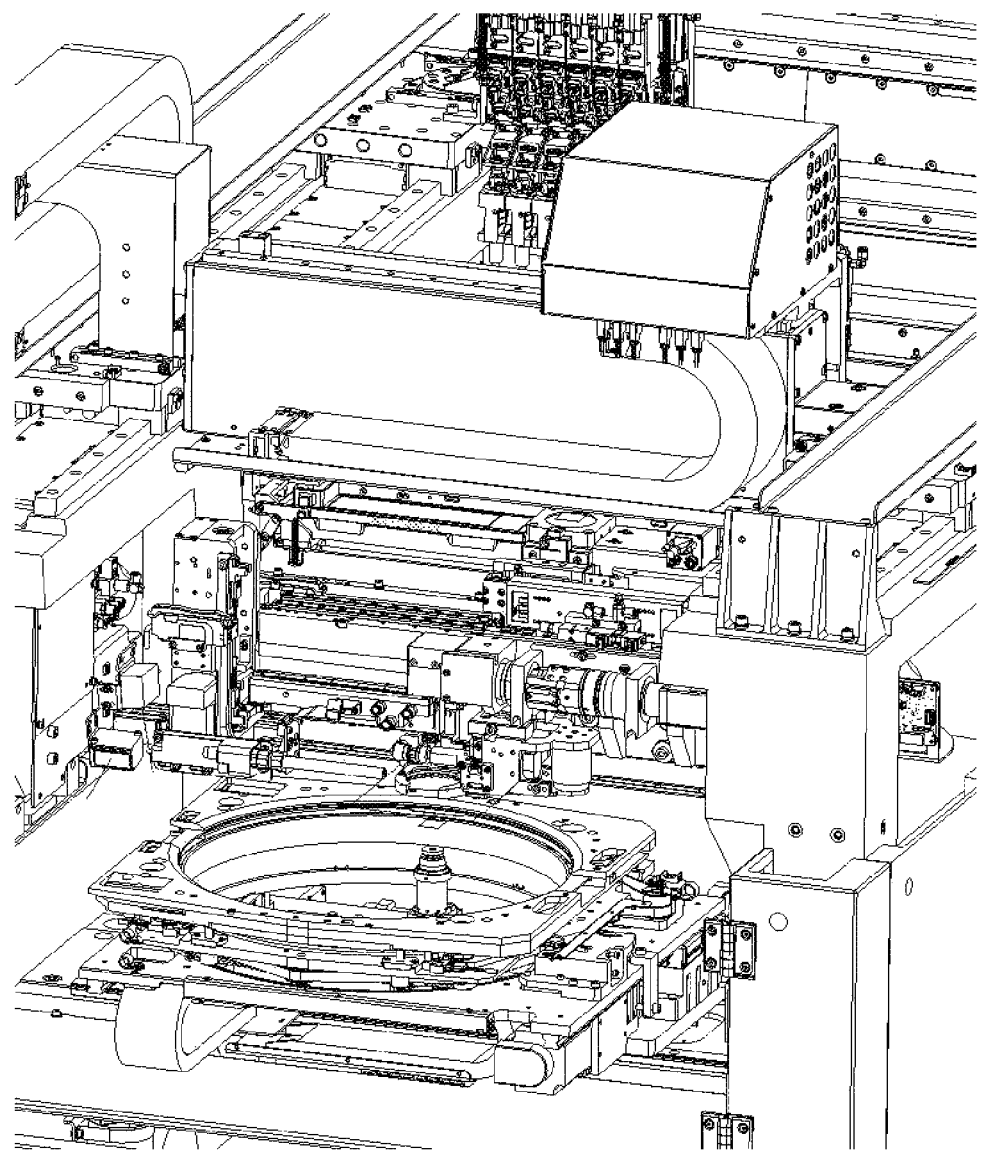
FIG. 6 is a partially enlarged perspective view of the component packaging apparatus shown in FIG. 1, mainly showing the component processing device and the component transfer device.
Figure 7:
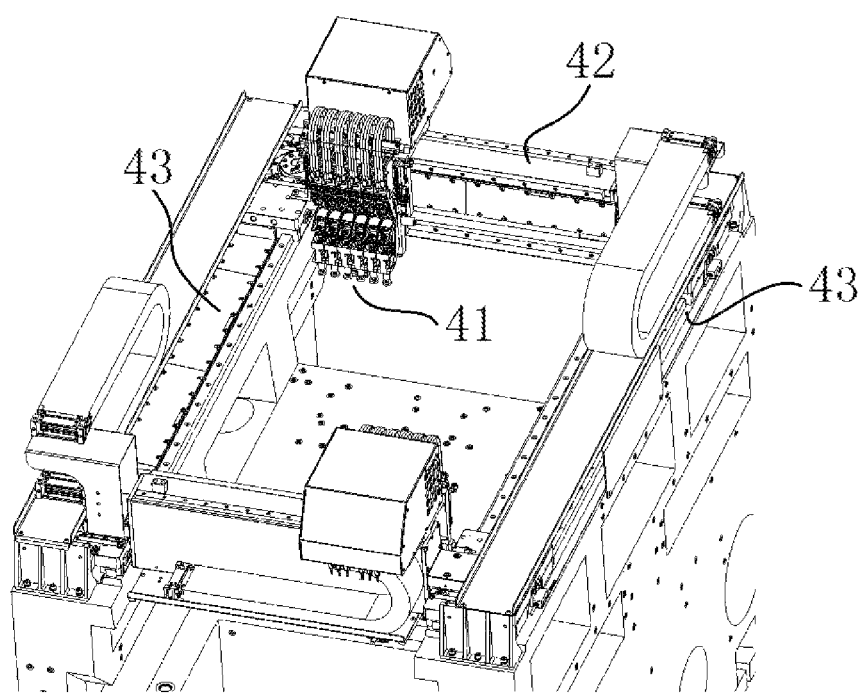
FIG. 7 is a partially enlarged perspective view of the component packaging apparatus shown in FIG. 1, mainly showing the component transfer device.

Referring to FIGS. 6 and 7, the component transfer device 40 in the component packaging apparatus will be described in detail. As shown, the component transfer device 40 mainly comprises multiple bond heads 41 (six bond heads in the figure) mounted together and a driving mechanism (not shown). The bond head 41 is mounted on a beam 42, and the ends of the beam 42 are respectively mounted on the two longitudinal rails 43. The multiple bond heads 41 can be moved together along the beam 42 in the length direction of the beam 42, and the beam 42 can be moved along the longitudinal rails 43, thereby enabling the multiple bond heads 41 to move together in horizontal and vertical direction. Further, the multiple bond heads 41 are disposed to be independently movable in the vertical direction relative to the beam 42, and disposed to be independently rotatable around respective axis.

Accordingly, the bond heads 41 have sufficient freedom of movement to perform any fine movement to complete a precise operation process. Further, the horizontal distance between the bond heads 41 can also be adjusted such that each of the bond heads 41 is aligned with the corresponding placement station 39 of the plate 38 on the pickup platform 37.

Figure 8:
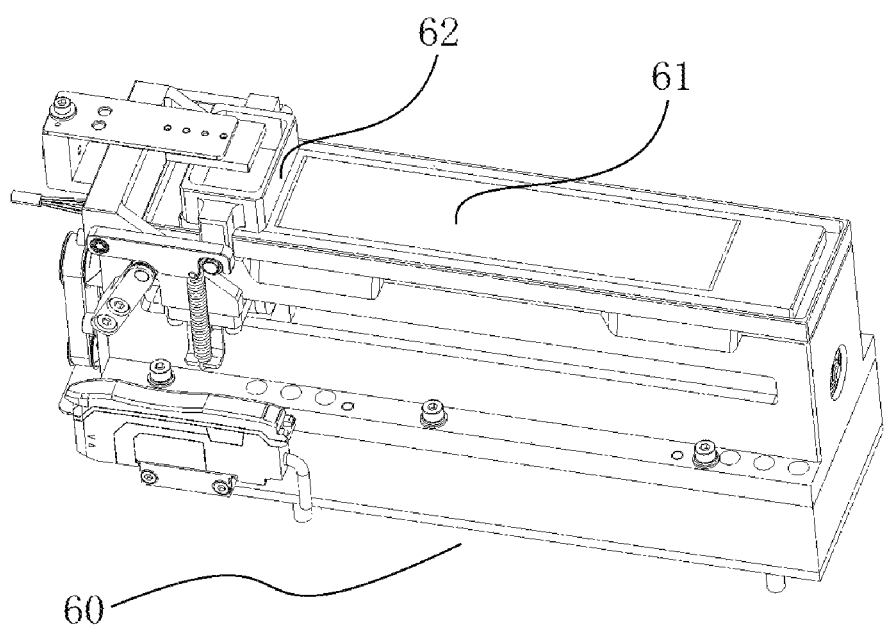
FIG. 8 is a perspective view of the dipping station of the component packaging apparatus shown in FIG. 1.

Referring to FIG. 8, a perspective view of the dipping station 60 of the component packaging apparatus of FIG. 1 is shown. As shown, the dipping station 60 has a receptacle 61 for receiving flux. The receptacle 61 is configured to allow multiple die components on the bond heads of a component transfer device to be dipped into the flux simultaneously. In addition, the dipping station further comprises flux dispenser 62 configured to be movable along the receptacle 61 to uniformly apply flux to the receptacle 61.

A method for packaging a component according to the present invention will be described in detail below. As an example, reference will now be made to FIGS. 9-12, and the method is implemented by the apparatus as shown in FIG. 1. However, it should be noted that the component packaging method similar to the present invention can also be used to package suitable components other than the die, and can also be implemented using other devices than the device shown in FIG. 1.

Figure 9:
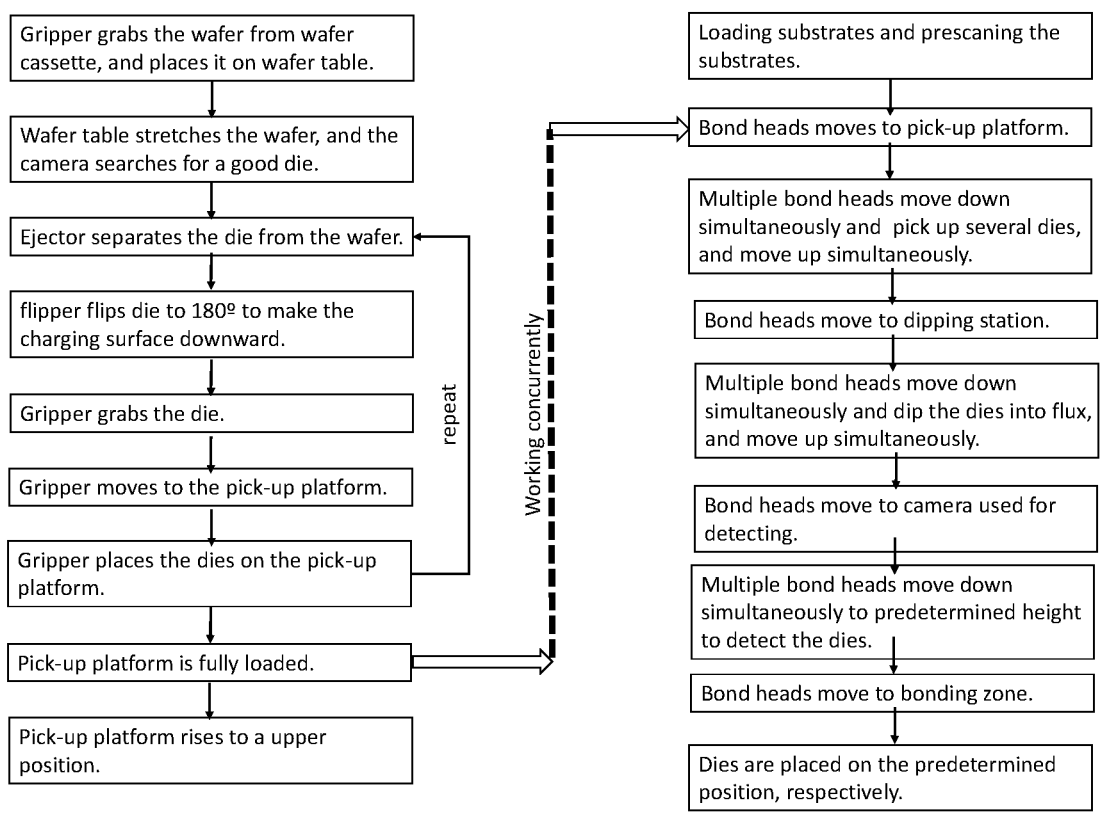
FIG. 9 is a flowchart of one example of a method for packaging components according to the present invention.

Referring to FIG. 9, the various steps of the exemplary method are illustrated. For the processing operation, the wafer cassette and the substrate are first loaded to the component supply device. Certainly, the substrate can also be loaded in a subsequent step as shown in the figure. After that, the component packaging device is initiated, and the gripper in the component processing device will grab the wafer and put it on the wafer table under the control of the control system of the device. The wafer table stretches the wafer so that the camera detects the wafer and searches for a good die. Then, the ejector separates the die from the wafer. Thereafter, the flipper flips the detached die on the wafer table and reverses the direction of the die, and then the gripper places the die on the designated placement station of the pick-up platform. When there are enough dies to be loaded onto the pick-up platform, the bond heads move over the pick-up platform and at the same time pick up several dies on the pick-up platform simultaneously, then continue to move over the dipping station. Then, the dies are simultaneously dipped in the flux receptacle and the multiple dies are simultaneously dipped into flux. The bond heads continue moving to complete other multiple steps, including bonding the dies to the substrates. The specifics of these steps are described in the flowchart shown in FIG. 9 for details.

Figure 10:
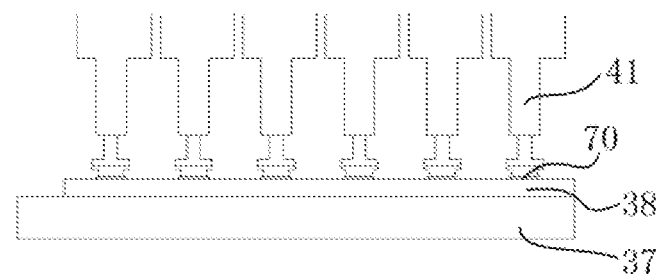
FIG. 10 is a chematic view of the picking step of the method in FIG. 9.
Figure 11A:
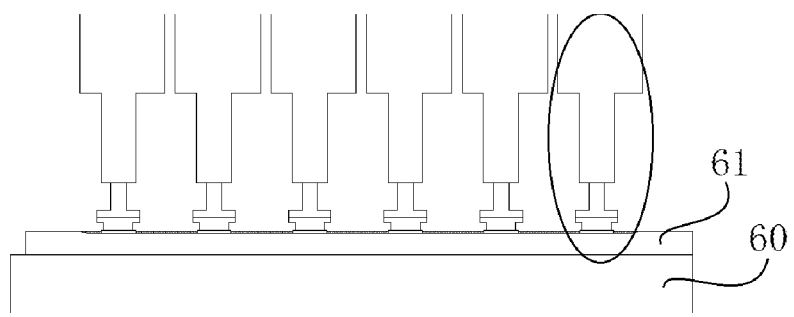
Figure 11B:
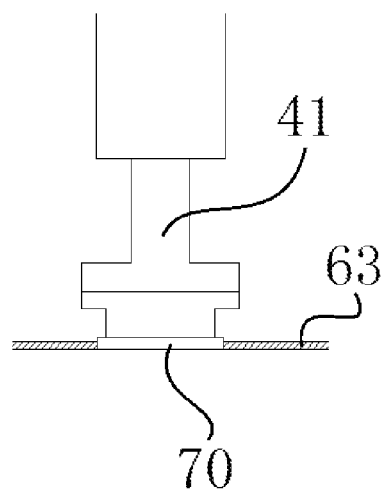

An important feature of the method is that multiple bond heads 41 simultaneously pick up multiple dies 70 on the plate 38 from the pick-up platform 37, as shown in FIG. 10. Further, another important feature of the method is that the multiple dies 70 are simultaneously dipped into flux 63 in the receptacle 61 of the dipping station 60, as shown in FIGS. 11*a* and 11*b*.

Figure 12A:
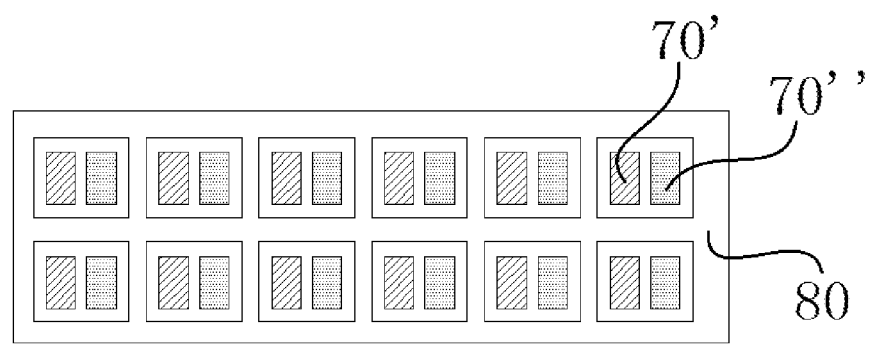
Figure 12B:
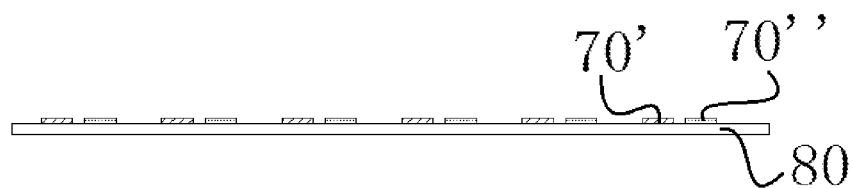

FIG. 12 illustrates another embodiment of a method according to the present invention. As shown, two different dies 70' and 70" are bonded side by side to the same substrate 80. To implement this embodiment, some changes to the aforementioned method steps are required. First, the die 70' is loaded on one of the component supply devices of the component package apparatus shown in FIG. 1, and the die 70" is loaded on the other component supply device. Accordingly, the substrate supply device needs to be recombined so that two of the channels become one channel to provide one type of substrate on the substrate supply device. In the process, die 70' and die 70" are processed by two independently operated component processing devices and component transfer devices, and are transferred to said one substrate for bonding. That is to say, this example enables a single apparatus to process two different dies simultaneously and achieves simultaneous bonding of two different dies on the same substrate. Those skilled in the art will understand, based on the spirit and principles of the present invention, more devices can be added to the component packaging apparatus so that more different types of dies can be bonded to the same substrate for more complex processing.

In addition to the above advantages, the present invention is particularly characterized by high processing efficiency. A technical effect regarding productivity in the present invention will be described below with reference to a typical prior art.

Figure 13:
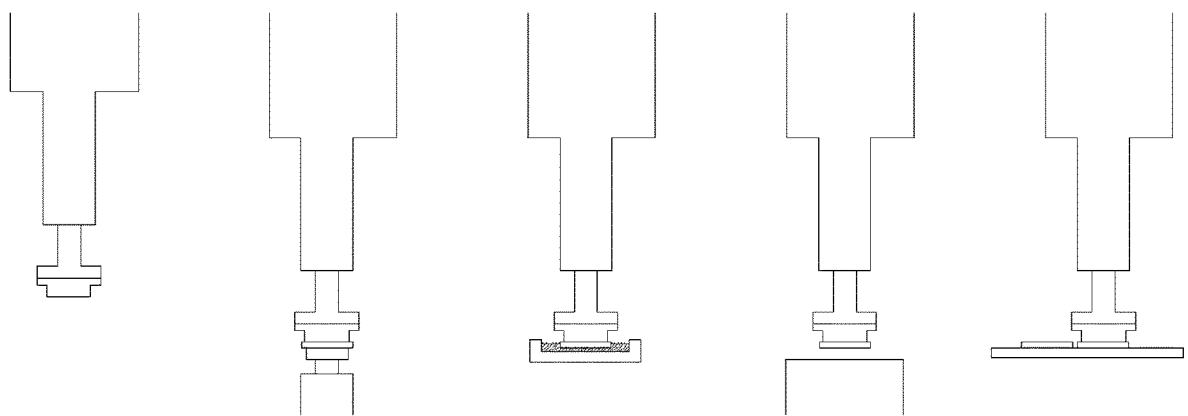
FIG. 13 is a schematic flow chart of a method for component packaging by using a single bond head in the prior art.

FIG. 13 illustrates a prior art for packaging components using a single bond head. As shown, the bond head is returned to the home position for the picking step and dipping step for the next die after the picking step and the dipping step for the previous die are completed. It will be understood that for embodiments using six bond heads in the present invention, at least 90% time can be saved, i.e., the present invention can increase the productivity by at least 10 times than the prior art.

Figure 14A:
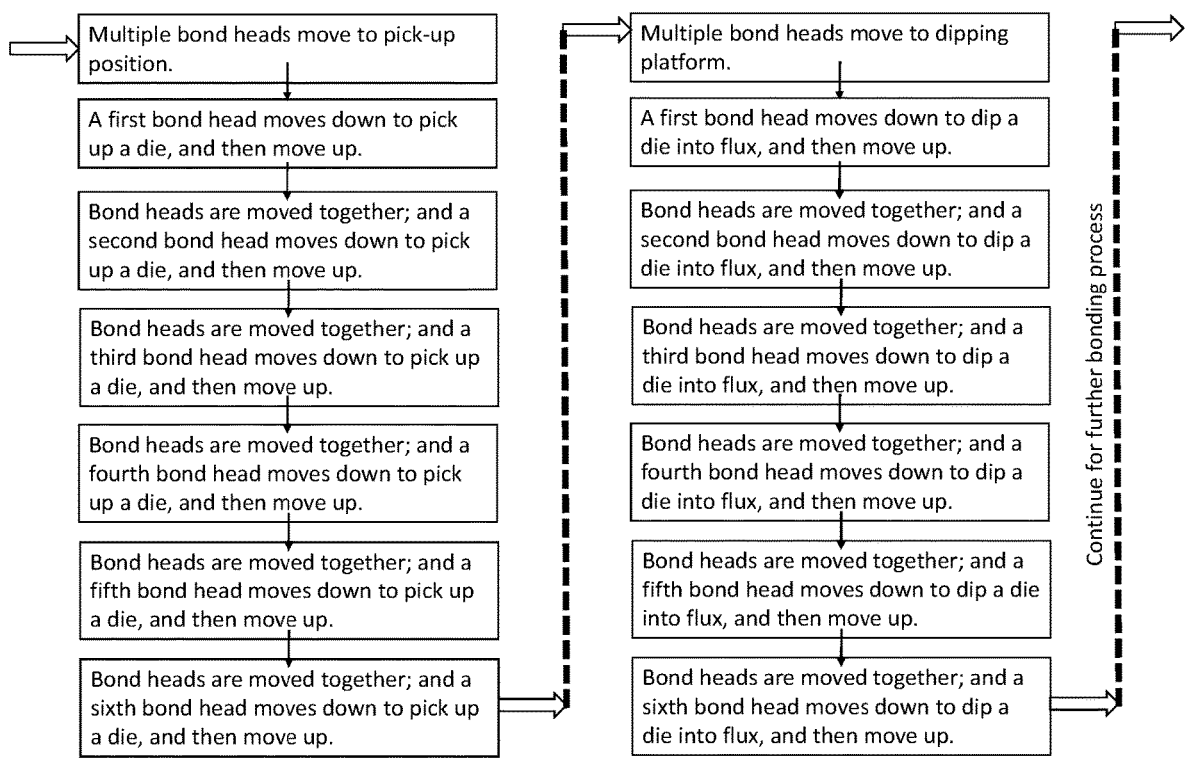
Figure 14B:
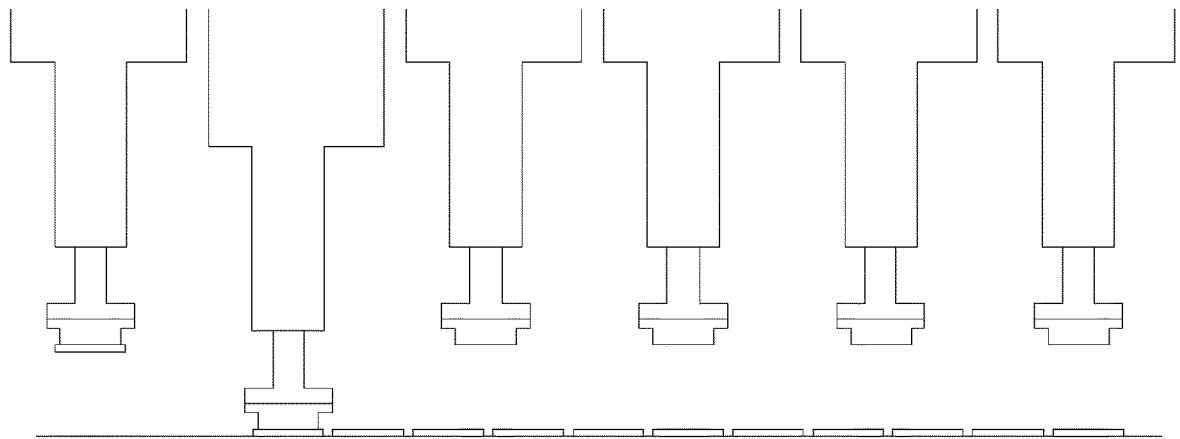
Figure 14C:
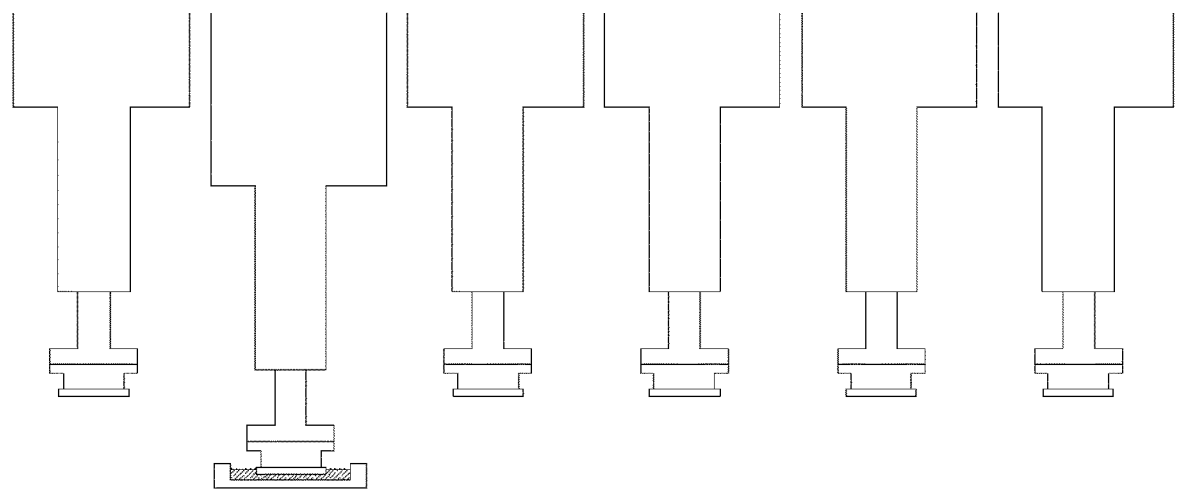

FIGS. 14A-14C shows a component packaging method using multiple bond heads in prior art. Referring to 14A and 14B, multiple bond heads are also used in the packaging method, but the bond heads are operated separately. In the prior art, a bond head picks up a die, and then the multiple bond heads must be moved together. So, the next bond head is aligned with the next die before the following die pick is implemented. This is because the distance between the multiple bond heads is fixed, but the distance between the dies, which are ready-to-pick, may not be fixed. And there may be one or several unqualified die (s) between the two ready-to-pick die, so the movement of the bond heads must be controlled based on the position of the qualified die to align the bond head with a single ready-to-pick die. To this end, the present invention can increase the productivity by at least 10 times in the picking step. Referring to FIG. 14C, in the prior art, the multiple bond heads are also dipped one by one in the dipping step. That is to say, all the bond heads move together after the previous bond head completes the dipping step, and the latter bond head is aligned with the flux receptacle for successful dipping. It can be understood that the present invention can further increase the productivity by 10 times in the dipping step compared to that of the prior art.

The invention has been described above by one or more preferred examples and one or more alternative embodiments. In addition, various aspects of the invention are also described. The various aspects or embodiments should not be construed as limited, but should be construed as illustrative. It is to be understood that such other embodiments are also falling within the scope of the invention. The scope of the invention will be determined by the claims.

What is claimed is:

1. A component packaging apparatus, comprising:
   a main body having an upper level configured to apply component picking, dipping, and bonding action and a lower level configured to apply component feeding action; and
   at least two component supply devices located outside said main body at a forward and a rear position respectively;
   said main body including:
   at least two component processing devices located at said lower level at a forward and a rear position respectively, each of which is configured to process components provided by the corresponding component supply device;
   at least two pick-up platforms that accept components from the corresponding component processing devices, each of said pick-up platform configured to move up and down between said bottom level and said upper level;

at least two component transfer devices located at said upper level, each component transfer device respectively having multiple bond heads, and each bond head transferring one of the said components which are processed by the corresponding component processing devices to a substrate;

a substrate supply device located in a central location at said upper level and configured to provide at least one substrate, and the component(s) is/are bonded to the corresponding substrate(s) by the bond head(s) after being dipped into a flux;

wherein each of the component processing devices comprises one of the pick-up platforms, respectively, which is configured to simultaneously arrange multiple components; and the multiple bond heads are configured to pick up the multiple components simultaneously from the pick-up platform at one time;

wherein the substrate supply device is disposed between the at least two component supply devices; and the at least two component processing devices and the at least two component transfer devices are disposed on the same side of the substrate supply device and the at least two component supply devices.

2. A component packaging apparatus according to claim 1, wherein the at least two component supply devices, the at least two component processing devices, and the at least two component transfer devices are arranged symmetrically and operated independently of each other.

3. A component packaging apparatus according to claim 1, wherein the at least two component transfer devices are correspondingly disposed on said upper level above the at least two component processing devices on said lower level, and each pick-up platform is configured to be positioned on the lower level when components are processed by the respective component processing device, vertically moved to an upper position when the respective pick-up platform is full and ready for component transfer device to pick away, and vertically moved to a lower position when the pick-up platform is emptied by the respective component transfer device.

4. A component packaging apparatus according to claim 1, wherein the component packaging apparatus further comprises at least two dipping stations operated independently, the dipping stations being located on said upper level between the corresponding pick-up platform and corresponding substrate supply device, each dipping station having a receptacle containing flux, and the receptacle being configured to allow the multiple components on the bond heads to be simultaneously dipped into flux at one time.

5. A component packaging apparatus according to claim 4, wherein each dipping station further comprises a dispenser, which is configured to fill the receptacle with flux.

6. A component packaging apparatus according to claim 1, wherein each component transfer device comprises a beam, and the multiple bond heads are mounted on the beam and can move along the beam in the direction of length of beam.

7. A component packaging apparatus according to claim 6, wherein the multiple bond heads are configured to be movable together with the beam front toward rear in the horizontal direction.

8. A component packaging apparatus according to claim 1, wherein the multiple bond heads are configured to be independently movable in the vertical direction relative to a beam.

9. A component packaging apparatus according to claim 1, wherein the multiple bond heads are configured to be independently rotatable around a respective shaft center.

10. A component packaging apparatus according to claim 1, wherein the multiple bond heads are configured such that the horizontal distance between each bond head can be adjusted.

11. A component packaging apparatus according to claim 1, wherein the at least two component supply devices respectively provide different components.

12. A component packaging apparatus according to claim 1, wherein each component processing device is configured to process the components provided by the corresponding component supply device.

13. A component packaging apparatus according to claim 1, wherein each component processing device comprises a flipper for flipping the charging surface of the component from upward to downward.

14. A component packaging apparatus according to claim 1, wherein the pick-up platform is provided with a first vacuum device for fixing the components.

15. A component packaging apparatus according to claim 1, wherein the pick-up platform is configured to can be adjusted to arrange a different number of components.

16. A component packaging apparatus according to claim 1, wherein the pick-up platform can be adjusted such that each component is arranged to be aligned with a corresponding bond head.

17. A component packaging apparatus according to claim 1, wherein the substrate supply device comprises at least two channels, and each channel is configured to support one of the substrates.

18. A component packaging apparatus according to claim 17, wherein the at least two channels can be recombined into one channel to accommodate substrates having different sizes.

19. A component packaging apparatus according to claim 1, wherein the substrate supply device has a second vacuum device to fix the substrates.

20. A method for packaging components, comprising:
providing components by a first and second component supply devices, which are located at a forward and a rear position outside of a main body having an upper level and a lower level, the upper level to apply component picking, dipping, and bonding action and the lower level to apply component feeding action;
processing the components by a first and second component processing devices, which are located at the lower level at a forward and a rear position of the main body, respectively, and arranging the multiple components on a pick-up platform;
picking up the multiple components from the respective pick-up platform by a first and second component transfer devices, which are located at the upper level, using multiple bond heads mounted on the beam, each bond head transferring one of the components;
dipping the said multiple components on the bond heads into flux in the flux receptacle at the dipping station;
providing substrates by a substrate supply device, which is located in a central location on the upper level, and bonding the components, which have been dipped into flux, to the substrates by the multiple bond heads;
wherein the multiple bond heads pick the multiple components simultaneously from the respective pick-up platform at one time;
wherein the substrate supply device is disposed between the first and second component supply devices; and the first and second component processing devices and the first and second component transfer devices are disposed on the same side of the substrate supply device and the first and second component supply devices, wherein the first and second component transfer devices have the multiple bond heads, and wherein the first and second component processing devices each have the respective pick-up platform.

21. A method according to claim 20, wherein the first and second component supply devices, the first and second component processing devices, and the first and second component transfer devices are arranged symmetrically and operated independently of each other.

22. A method according to claim 20, wherein the first and second component transfer devices are correspondingly disposed above the first and second component processing devices, and the pick-up platform is configured to be vertically adjustable in height such that the components can be loaded and the loaded components can be obtained by the first or second component transfer device.

23. A method according to claim 20, wherein the multiple components on the bond heads are simultaneously dipped into flux at one time.

24. A method according to claim 23, wherein the method further comprises adding flux to the receptacle by a flux dispenser.

25. A method according to claim 20, wherein the method further comprises moving the bond heads along a beam in the direction of length of the beam, such that each bond head is aligned with the corresponding component on the pick-up platform.

26. A method according to claim 20, wherein the method further comprises moving the bond heads in the vertical direction relative to a beam, such that each bond head is aligned with the corresponding component on the pick-up platform.

27. A method according to claim 20, wherein the method further comprises moving the bond heads relative to a beam in a horizontal direction perpendicular to the beam, such that each bond head is aligned with the corresponding component on the pick-up platform.

28. A method according to claim 20, wherein the first and second component supply devices provide different components.

29. A method according to claim 20, wherein the method further comprises reversing the components upside down by the flipper.

30. A method according to claim 20, wherein the substrate supply device comprises at least two channels, and each channel is configured to support one of the substrates.

31. A method according to claim 30, wherein the at least two channels can be recombined into a single channel to accommodate substrates having different sizes.

* * * * *